United States Patent
Kralick et al.

(10) Patent No.: US 9,995,804 B2
(45) Date of Patent: Jun. 12, 2018

(54) SYSTEM AND METHOD FOR LOCATING A GRADIENT COIL

(71) Applicant: KONINKLIJKE PHILIPS N.V., Eindhoven (NL)

(72) Inventors: James Howard Kralick, Albany, NY (US); Frank Battista, Latham, NY (US); Jeffrey Edward Leach, Rexford, NY (US); Dennis Ambrose Becker, Bennington, VT (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 756 days.

(21) Appl. No.: 14/396,974

(22) PCT Filed: Apr. 9, 2013

(86) PCT No.: PCT/IB2013/052817
§ 371 (c)(1),
(2) Date: Oct. 24, 2014

(87) PCT Pub. No.: WO2013/160783
PCT Pub. Date: Oct. 31, 2013

(65) Prior Publication Data
US 2015/0091575 A1    Apr. 2, 2015

Related U.S. Application Data

(60) Provisional application No. 61/637,885, filed on Apr. 25, 2012, provisional application No. 61/710,201, filed on Oct. 5, 2012.

(51) Int. Cl.
*G01R 33/30*    (2006.01)
*G01R 33/385*    (2006.01)
(Continued)

(52) U.S. Cl.
CPC ........ *G01R 33/3858* (2013.01); *G01R 33/24* (2013.01); *G01R 33/307* (2013.01); *G01R 33/387* (2013.01); *G01R 33/243* (2013.01)

(58) Field of Classification Search
CPC .............. G01R 33/385; G01R 33/3858; G01R 33/3854; G01R 33/3856; G01R 33/56509;
(Continued)

(56) References Cited

U.S. PATENT DOCUMENTS 4,920,316 A    4/1990 Egloff
4,949,044 A    8/1990 Starewicz
(Continued)

FOREIGN PATENT DOCUMENTS

EP    0552542 A1    7/1993

OTHER PUBLICATIONS

MFC-3045 Magnetic Field Camera, User's Manual by MetroLab Instrument SA.*

*Primary Examiner* — Clayton E Laballe
*Assistant Examiner* — Ruifeng Pu

(57) ABSTRACT

A magnetic resonance imaging (MRI) system includes an MRI magnet (100) including a bore (101) and having a magnetic field and a gradient coil (400) disposed within the bore and having an isocenter (404). A first location within the MRI magnet is determined with respect to a first predetermined reference surface of the MRI magnet, the first location representing a center (104) of the magnetic field. A second location within the gradient coil is determined with respect to a second predetermined reference surface of the gradient coil, the second location representing the isocenter. When the gradient coil is installed within the bore, the second predetermined reference surface abuts the first predetermined reference surface. The first predetermined reference surface is adjusted to an adjusted position, the (Continued)

adjusted position being determined as a function of the first location and the second location and corresponding to a position of the first predetermined reference surface at which the first location coincides with the second location when the gradient coil is installed within the bore.

13 Claims, 8 Drawing Sheets

(51) Int. Cl.
  *G01R 33/387* (2006.01)
  *G01R 33/24* (2006.01)
(58) Field of Classification Search
  CPC .......... Y10T 29/53265; Y10T 29/5313; Y10T 29/53261
  See application file for complete search history.

(56) References Cited

U.S. PATENT DOCUMENTS

| | | |
|---|---|---|
| 5,278,504 A | 1/1994 | Patrick |
| 5,783,943 A | 7/1998 | Mastandrea |
| 7,191,513 B2 | 3/2007 | Schuster |
| 7,336,075 B2 | 2/2008 | Schuster |
| 7,463,028 B2 | 12/2008 | Dietz |
| 8,082,662 B2 | 12/2011 | Schroeder |
| 2009/0079430 A1 | 3/2009 | Yamashita |

* cited by examiner

SYSTEM AND METHOD FOR LOCATING A GRADIENT COIL

CROSS-REFERENCE TO PRIOR APPLICATIONS

This application is the US National Phase application under 35 U.S.C. § 371 of International Application No. PCT/IB2013/052817, filed on Apr. 9, 2013, which claims the benefit of U.S. Provisional Application No. 61/637,885, filed on Apr. 25, 2012, and U.S. Provisional Application No. 61/710,201 filed on Oct. 5, 2012. These applications are hereby incorporated by reference herein.

The present disclosure generally relates to magnetic resonance imaging (MRI), and, in particular, to a system, apparatus, arrangement, and method for positioning the isocenter of a gradient coil of an MRI system coincident with the magnetic center of an MRI magnet.

There are two typical methods for applying iron plates within a magnetic field of an MRI magnet to achieve a desired homogeneity (which is usually specified in PPM—Parts per Million). According to one method, the iron plates can be attached directly to the inner bore of the magnet and placed about the mechanical center of the magnet. This method can provide a fixed position of the iron, however, this method has several disadvantages. For example, the placement of the iron is typically farther away from the location of the magnetic isocenter, which can require more iron to be used to achieve the required homogeneity. Further, if more iron is required to achieve the desired homogeneity, the external structure to support the magnetic loads on the iron can sacrifice patient space.

Alternatively, the iron plates can be placed within the structure of the gradient coil, which typically positions the iron plates to a more central and efficient location with the magnetic field. However, the axial location of these iron plates can be influenced by the axial position of the gradient coil. Accordingly, if the isocenter of the gradient coil and thus the axial position of the iron is not located about the magnetic center of the MRI, then: (1) the field homogeneity may be altered and may not meet the design specifications; and/or (2) the axial force imparted by the now fixed axial position of the iron on the suspended main coil structure of the magnet may cause the main magnetic coil structure to be displaced, causing the thermal gaps within the magnet to close and possibly touch. Further, this axial force caused by the misplaced axial location of the iron will likely put additional loads on the suspension system supporting the main coil structure. These additional loads on the suspension may exceed the strength of the supporting members causing them to fail.

Exemplary embodiments of the present disclosure can provide, for example, systems, apparatus, arrangements, and methods for accurately locating the magnetic center of an MRI machine and positioning the isocenter of the gradient coil coincident with the magnetic center of the MRI machine. Aspects of the present disclosure can provide a more homogeneous magnetic field with the MRI and can reduce the forces imparted on the coil suspension system.

An exemplary embodiment of the present invention can provide a method for locating the magnetic center of an MRI magnet with the isocenter of a gradient coil. The method can include the steps of (a) determining a first location within a magnetic resonance imaging (MRI) magnet with respect to a first predetermined reference surface of the MRI magnet, the first location representing a center of a magnetic field of the MRI magnet; (b) determining a second location within a gradient coil with respect to a second predetermined reference surface of the gradient coil, the second location representing an isocenter of the gradient coil, wherein when the gradient coil is installed within a bore of the MRI magnet, the second predetermined reference surface abuts the first predetermined reference surface; and (c) determining an adjusted position for the first predetermined reference surface as a function of the first location and the second location, the adjusted position corresponding to a position of the first predetermined reference surface at which the first location coincides with the second location when the gradient coil is installed within the bore of the MRI magnet.

A further exemplary embodiment of the present invention can provide an MRI system. The MRI system can include an MRI magnet including a bore and having a magnetic field; and a gradient coil disposed within the bore and having an isocenter. A first location within the MRI magnet is determined with respect to a first predetermined reference surface of the MRI magnet, the first location representing a center of the magnetic field. A second location within the gradient coil is determined with respect to a second predetermined reference surface of the gradient coil, the second location representing the isocenter. When the gradient coil is installed within the bore, the second predetermined reference surface abuts the first predetermined reference surface. The first predetermined reference surface is adjusted to an adjusted position, the adjusted position being determined as a function of the first location and the second location and corresponding to a position of the first predetermined reference surface at which the first location coincides with the second location when the gradient coil is installed within the bore.

Yet another exemplary embodiment of the present invention can provide a computing system for locating the magnetic center of an MRI magnet with the isocenter of a gradient coil. The computing system includes a processor and a memory arrangement. The processor determines a first location within an MRI magnet with respect to a first predetermined reference surface of the MRI magnet, the first location representing a center of a magnetic field of the MRI magnet. The processor determines a second location within a gradient coil with respect to a second predetermined reference surface of the gradient coil, the second location representing an isocenter of the gradient coil. When the gradient coil is installed within a bore of the MRI magnet, the second predetermined reference surface abuts the first predetermined reference surface. The processor determined an adjusted position for the first predetermined reference surface as a function of the first location and the second location, the adjusted position corresponding to a position of the first predetermined reference surface at which the first location coincides with the second location when the gradient coil is installed within the bore of the MRI magnet.

The present invention is explained in greater detail in the following exemplary embodiments and with reference to the figures, where identical or similar elements are partly indicated by the same reference numerals, and the features of various exemplary embodiments being combinable. In the drawings FIG. 1A shows a diagram of an exemplary MRI magnet according to an exemplary embodiment of the present invention.

Figure 1A:
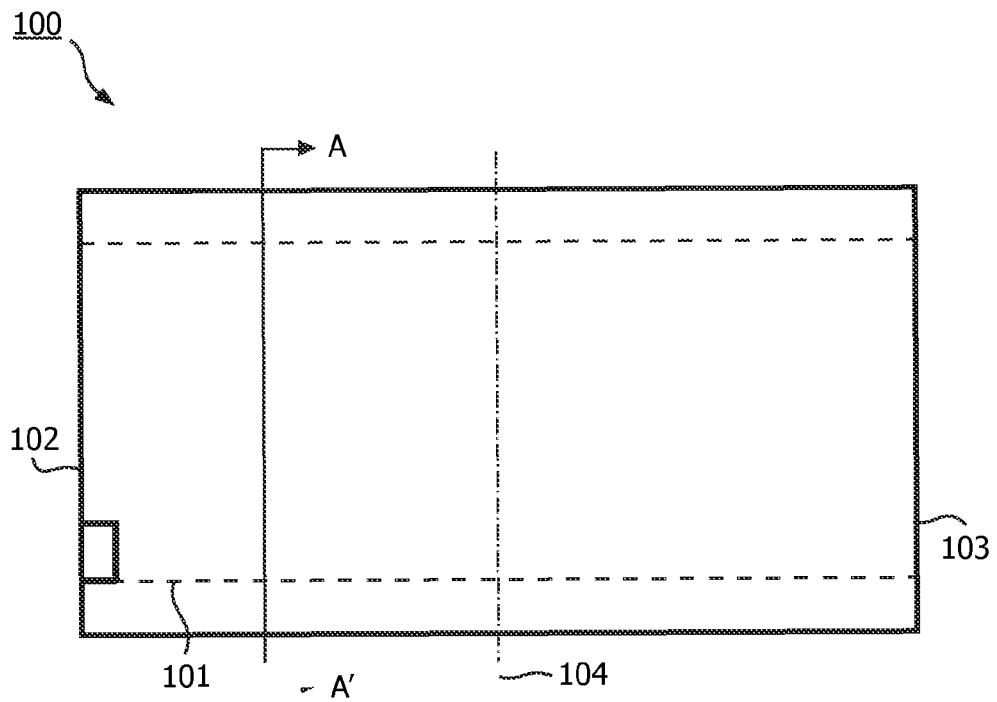
FIG. 1B shows a cross-sectional view of the exemplary MRI magnet of FIG. 1A taken along cutplane A-A' according to an exemplary embodiment of the present invention.

The exemplary embodiments may be further understood with reference to the following description and the appended drawings, wherein like elements are referred to with the same reference numerals. The exemplary embodiments relate to a method and system for locating the isocenter of a gradient coil coincident with the magnetic center of an MRI magnet. Although the exemplary embodiments are described with respect to an MRI imaging device, it will be understood by those of skill in the art that the systems and methods of the exemplary embodiments of the present invention may be used in any healthcare setting such as, for example, CT, PET, CAT imaging devices, etc.

Figure 1B:
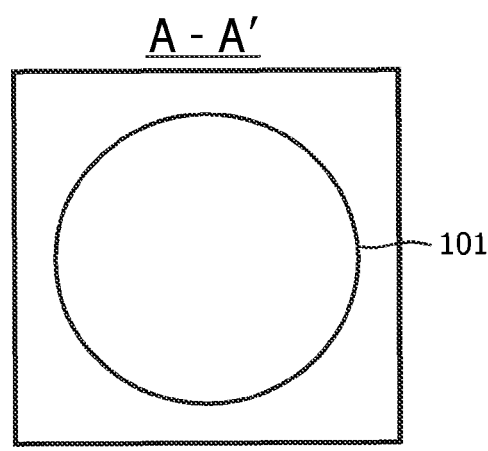

FIG. 1A shows a basic diagram of an exemplary MRI magnet 100 according to an exemplary embodiment of the present invention. The MRI magnet 100 includes a central bore 101 that extends longitudinally through the length of the MRI magnet 100. The MRI magnet 100 also includes two ends: a service end 102 and a patient end 103. The service end 102 serves as an area where the physician or MRI specialist controls the MRI procedures. Alternatively, the service end 102 may include a connection that is in communication with a remote service station in a remote location. The patient end 103 is the end through which a patient is moved into the central bore 101. The MRI magnet 100 also includes a magnetic center 104. The magnetic center 104 is the center of the magnetic field generated by the MRI magnet 100. FIG. 1B shows a cross-sectional view of the MRI magnet of FIG. 1A at cut plane A-A₁. Additionally, the MRI magnet 100 may include a patient bed (not shown) on which a patient rests while MRI procedures are conducted. The patient bed is typically moveably connected to the MRI magnet for extending and retracting the bed out of and back into the central bore 101 of the MRI magnet 100.

Figure 2A:
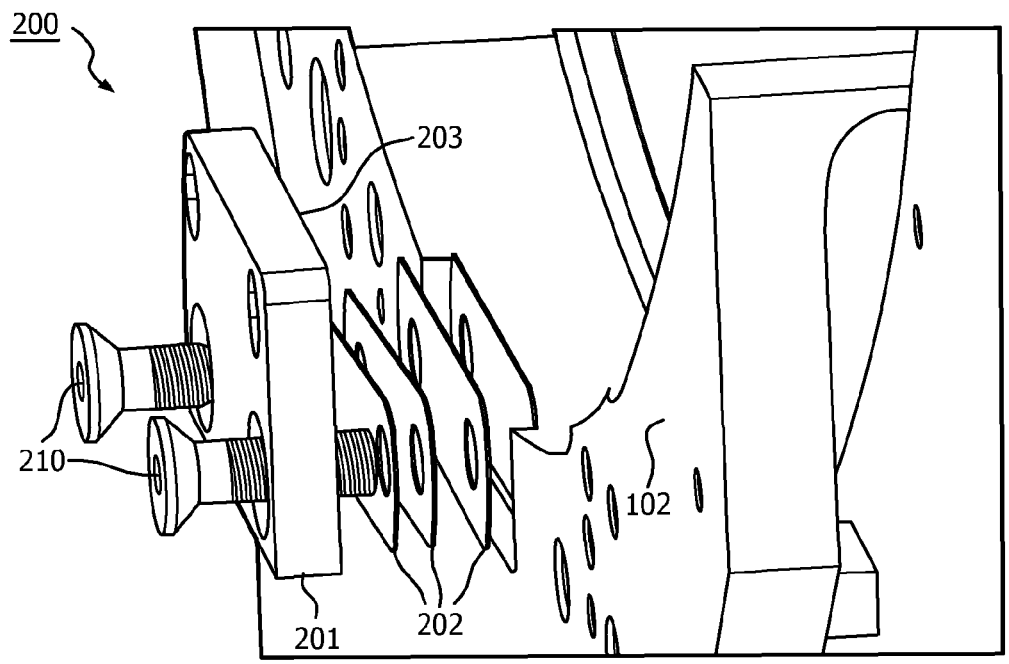
FIG. 2A shows an exploded view of the service end of an exemplary MRI magnet according to an exemplary embodiment of the present invention.

FIG. 2A shows an exploded view of the service end 102 of the MRI magnet 100 in accordance with exemplary embodiments of the present invention. According to an exemplary embodiment of the present invention, a stop plate assembly 200 is removably attached to the service end 102.

For example, the stop plate assembly 200 may be removably attached to the service end 102 via two screws 210 (as shown in FIG. 2A). Alternatively, the removable attachment may be via an adhesive (not shown). It should be noted that these examples are merely illustrative and that the exemplary embodiment is by no means limited to such attachments. The stop plate assembly 200 comprises a stop plate 201 and a predetermined number of shims 202. For example, the stop plate assembly 200 may include 24 shims with 12 of those shims being preinstalled. Alternatively, it should be understood that the stop plate assembly 200 may include any number of shims 202. The stop plate 201 includes a reference surface 203 which faces the central bore 101 of the MRI magnet 100. Each shim 202 has a predetermined thickness. For example, each shim may have a thickness of 0.5 mm. However, it should be understood that the shims 202 may be greater than or less than 0.5 mm and that this example is for illustrative purposes only. The shims 202 are preinstalled between the stop plate 201 and the service end 102 of the MRI magnet 100. Accordingly, in the example above, if 12 shims are preinstalled between the stop plate 201 and the service end 102, the reference surface 203 would be spaced 6 mm from the service end 102 of the MRI magnet 100. More shims 202 can be added or removed to position the reference surface 203 at a desired distance from the service end 102 of the MRI magnet 100. It should be noted that the shims 202 having the same width is only exemplary. According to a further exemplary embodiment, the shims 202 may have different widths to accommodate more total width dimensions.

Figure 2B:
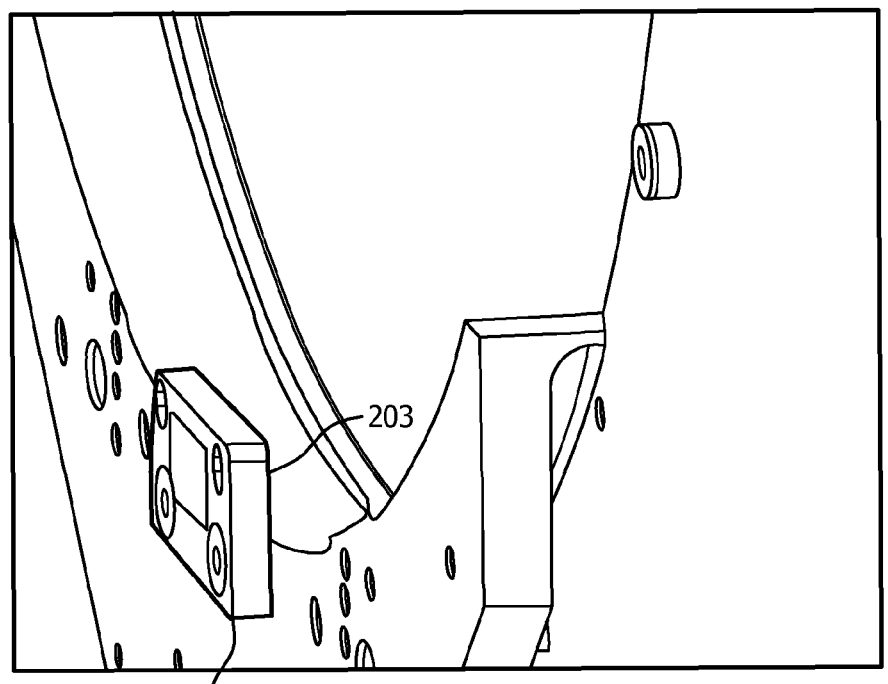
FIG. 2B shows an assembled view of the service end of the exemplary MRI magnet according to an exemplary embodiment of the present invention.

FIG. 2B shows an assembled view of the stop plate assembly 200 at the service end 102 of the MRI magnet 100. In this view, the shims 202 are not visible because they are situated between the stop plate 201 and the service end 102. As seen in FIG. 2B, when coupled, the stop plate 201 extends toward a center of the central bore 101 so that the upper portion of the stop plate 201 overlaps the opening to the central bore 101 at the service end 102 with the reference surface 203 facing the bore.

Figure 3A:
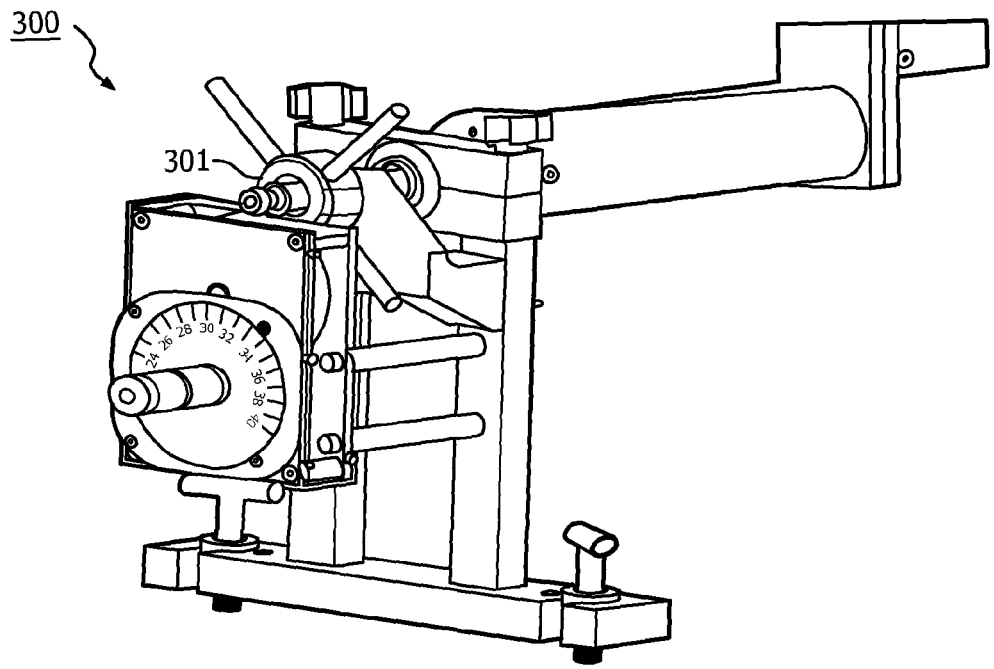
FIG. 3A shows an exemplary embodiment of a vernier hand wheel assembly used in an exemplary mapping procedure according to an exemplary embodiment of the present invention.
Figure 3B:
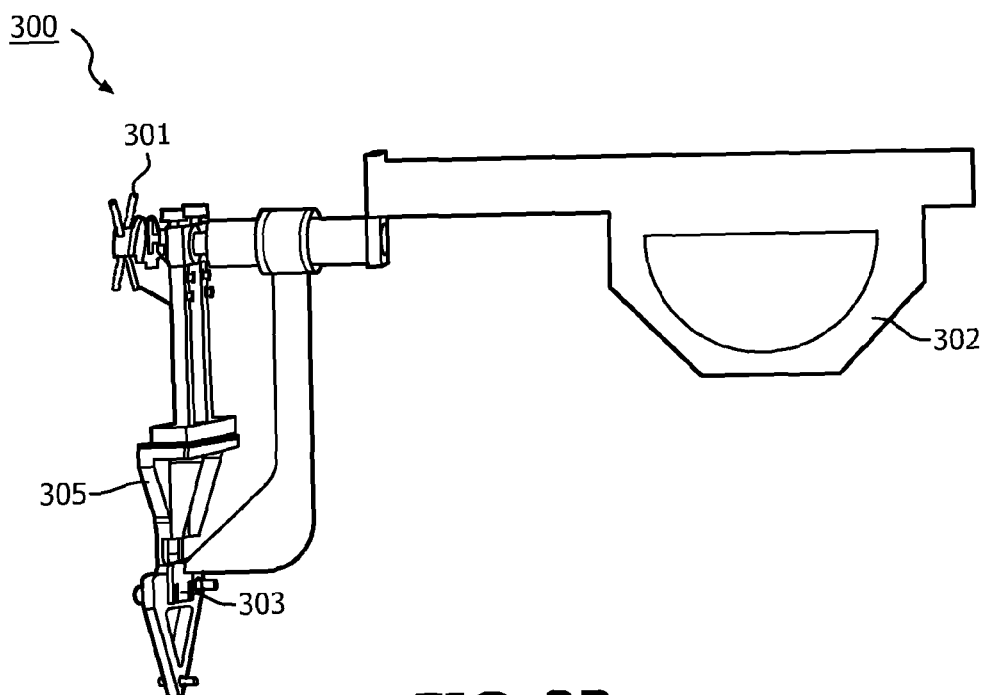
FIG. 3B shows an exemplary embodiment of mapping gantry according to an exemplary embodiment of the present invention.

FIGS. 3A and 3B show an example of a mapping gantry 300 used to determine the magnetic center 104 of the MRI magnet 100. The mapping gantry 300 includes a vernier hand wheel 301 which can be turned to move a camera 302 (shown in FIG. 3B) towards the patient end 103 or the service end 102 of the MRI magnet 100. The process for determining the magnetic center 104 will be discussed in more detail below.

FIG. 3B shows the camera 302 that is used to determine the magnetic center 104 of the MRI magnet 100 and the gantry support 305 to which the mapping gantry 300 is attached. The gantry support 305 replaces the stop plate assembly 200 and is attached to the service end 102 during the mapping procedure for determining the magnetic center 104. The gantry support 305 may be coupled to the service end 102 using substantially similar means as discussed above with reference to the stop plate assembly 200. The gantry support 305 includes a gantry reference surface 303 that is similar to the reference surface 203 of the stop plate 201. The mapping gantry 300 is used to take a map of the MRI magnet 100 to determine the location of the magnetic center 104. Such a map can be displayed to a user in the form of, e.g. a diagram of the MRI magnet 100 with an indicator showing the location of the magnetic center 104. It should be noted, however, that the map may be displayed to the user by any other method including, for example, a list of dimensions.

Figure 3C:
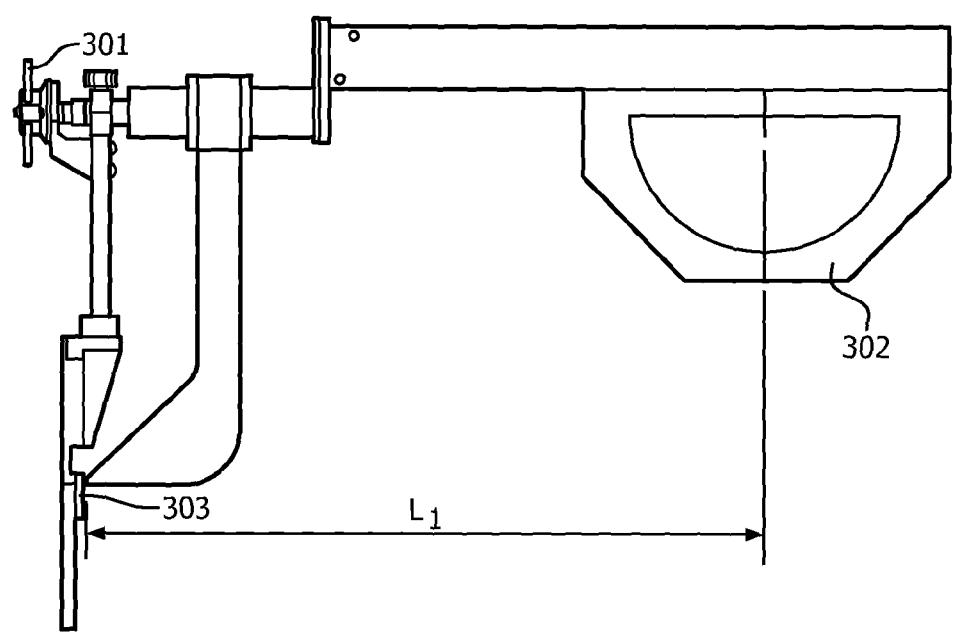
FIG. 3C shows an exemplary diagram of the mapping gantry according to an exemplary embodiment of the present invention.

As seen in FIG. 3C, the camera 302 is initially positioned at a distance $L_1$ from the gantry reference surface 303. This distance $L_1$ may be, for example, 845 mm. However, it should be understood that the distance $L_1$ may be any distance. During the mapping procedure, the vernier hand wheel 301 is turned to move the camera 302 towards the patient end 103 or the service end 102 of the MRI magnet 100. The distance traveled by the camera 302 as a result of the actuation of the vernier hand wheel 301 will dictate the number of shims 202 that will be placed between the reference surface 203 of the stop plate 201 and the service end 102 of the MRI magnet 100.

Figure 4A:
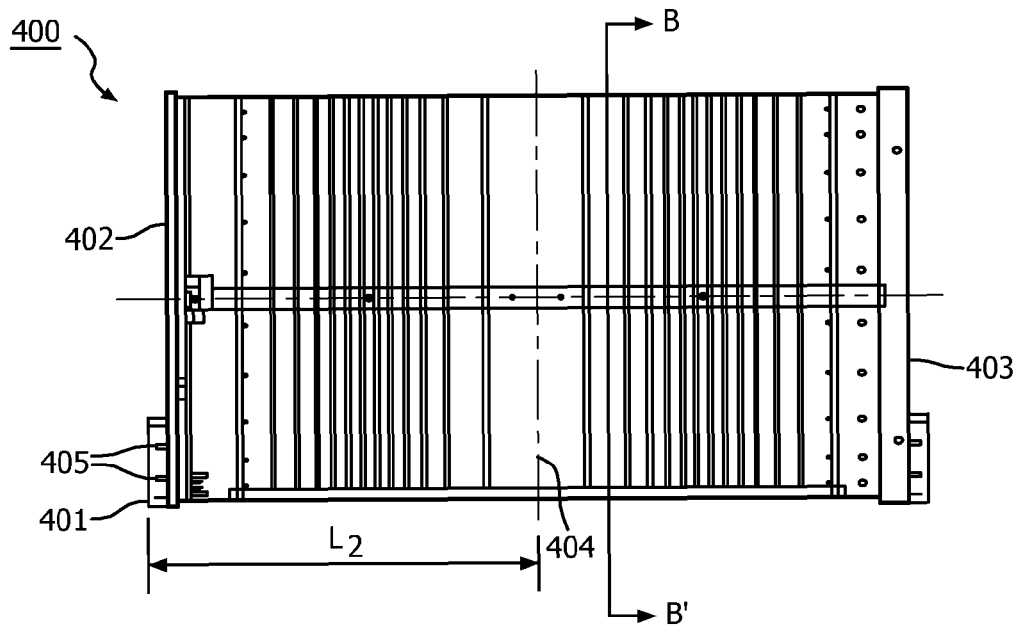
FIG. 4A shows an exemplary diagram of an exemplary gradient coil according to an exemplary embodiment of the present invention.
Figure 4B:
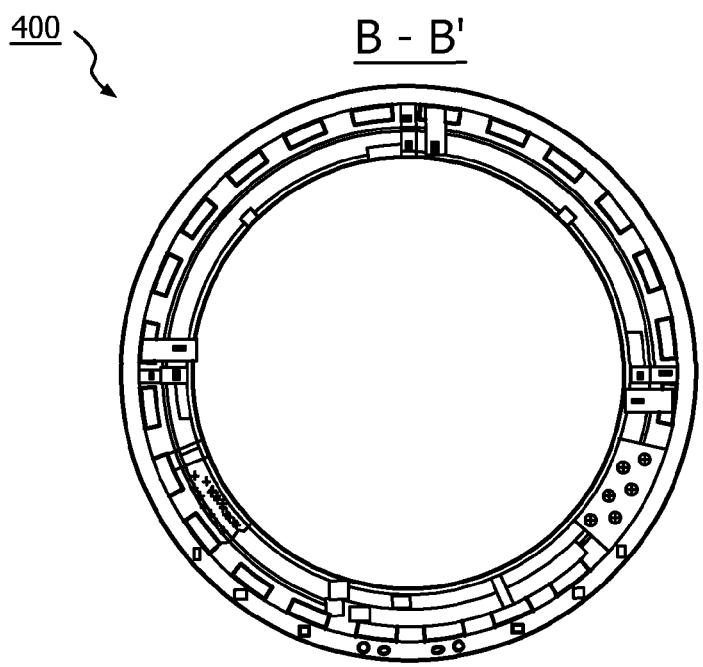
FIG. 4B shows a cross-sectional view of the exemplary gradient coil of FIG. 4A taken along cut plane B-B' according to an exemplary embodiment of the present invention.

FIGS. 4A and 4B show a gradient coil 400 according to an exemplary embodiment of the present invention. The gradient coil 400 is designed and shaped so that it may be placed inside the central bore 101 of the MRI magnet 100. The gradient coil 400 has a service end 402 and a patient end 403, which correspond to the service end 102 and the patient end 103 of the MRI magnet 100. The gradient coil 400 has an isocenter 404 that is a known distance $L_2$ (e.g., 851 mm) from a reference surface 401 located at the service end 402 of the gradient coil 400. The service end 402 includes an arrangement 405 for coupling the gradient coil 400 to the stop plate 201. Exemplary embodiments of the present invention can provide a system, apparatus, arrangement, and method to align the isocenter 404 with the magnetic center 104 when the gradient coil 400 is installed within the central bore 101 of the MRI magnet 100. This can be achieved by installing a determined number of shims 202 between the stop plate 201 and the service end 102.

Figure 5:
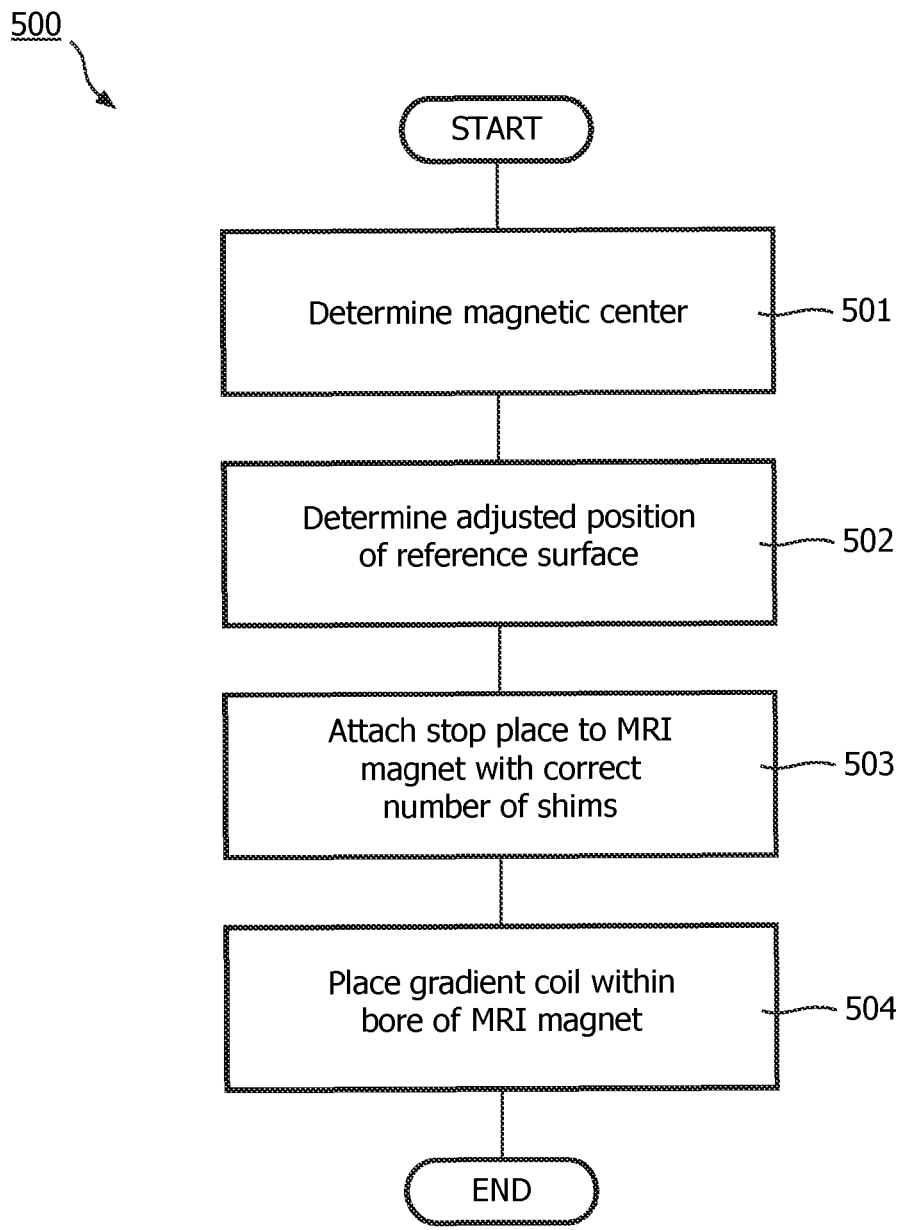
FIG. 5 shows an exemplary method for placing the isocenter of a gradient coil coincident with the magnetic center of an MRI magnet according to an exemplary embodiment of the present invention.

FIG. 5 shows a method 500 for aligning the isocenter 404 with the magnetic center 104 according to an exemplary embodiment of the present invention. In step 501, the magnetic center 104 of the MRI magnet 100 is determined using the mapping gantry 300. During this step, the stop plate assembly 200 is removed and the mapping gantry support 305 is installed instead. Initially, the camera 302 is located at a distance $L_3$ from the gantry reference surface 303. Preferably, the camera 302 is initially located at the geometric center of the MRI magnet 100. The mapping procedure is then performed and the magnetic center 104 of the MRI magnet 100 is determined.

In step 502, the adjusted position of the reference surface 203 is determined. Specifically, the vernier hand wheel 301 is turned (clockwise or counterclockwise) to move the camera 302 to place it at the determined magnetic center 104. For example, if the magnetic center 104 is displaced 3.5 mm away from the geometric center towards the patient end 103, turning the vernier hand wheel 301 clockwise 3½ turns can advance the camera 302 3.5 mm towards the patient end 103. Alternatively, turning the vernier wheel 301 counterclockwise would bring the camera 302 towards the service end 102. At this location, the final map can be taken. The resulting distance (i.e. the offset) traveled by the camera 302 to place it at the magnetic center 104 is then noted on the reference surface 203 of the stop plate 201. For example, this offset may be etched or engraved onto the reference surface 203. It should be noted, however, that any conventional means of placing an indication on a surface may be used to indicate this offset.

In step 503, the mapping gantry 300 and the mapping gantry support 305 are removed and the stop plate 201 is reinstalled with the determined number of shims 202. The determined number of shims 202 is dictated by the offset determined in step 502. Accordingly, in the above example, if each shim is 0.5 mm and the offset is 3.5 mm towards the patient end 103, then 7 of the 12 preinstalled shims should be removed so that the reference surface 203 is advanced 3.5 mm towards the patient end 103. It should be noted that these dimensions are for illustrative purposes only and that these dimensions will vary based on the specific MRI magnet 100 used and the thicknesses of the shims 202.

Finally, in step 504, the gradient coil 400 is placed inside the central bore 101 of the MRI magnet 100 so that the reference surface 401 of the gradient coil 400 sits flush against the reference surface 203 of the stop plate 200. In this position, the isocenter 404 of the gradient coil 400 coincides with the magnetic center 104 of the MRI magnet 100.

Figure 6:
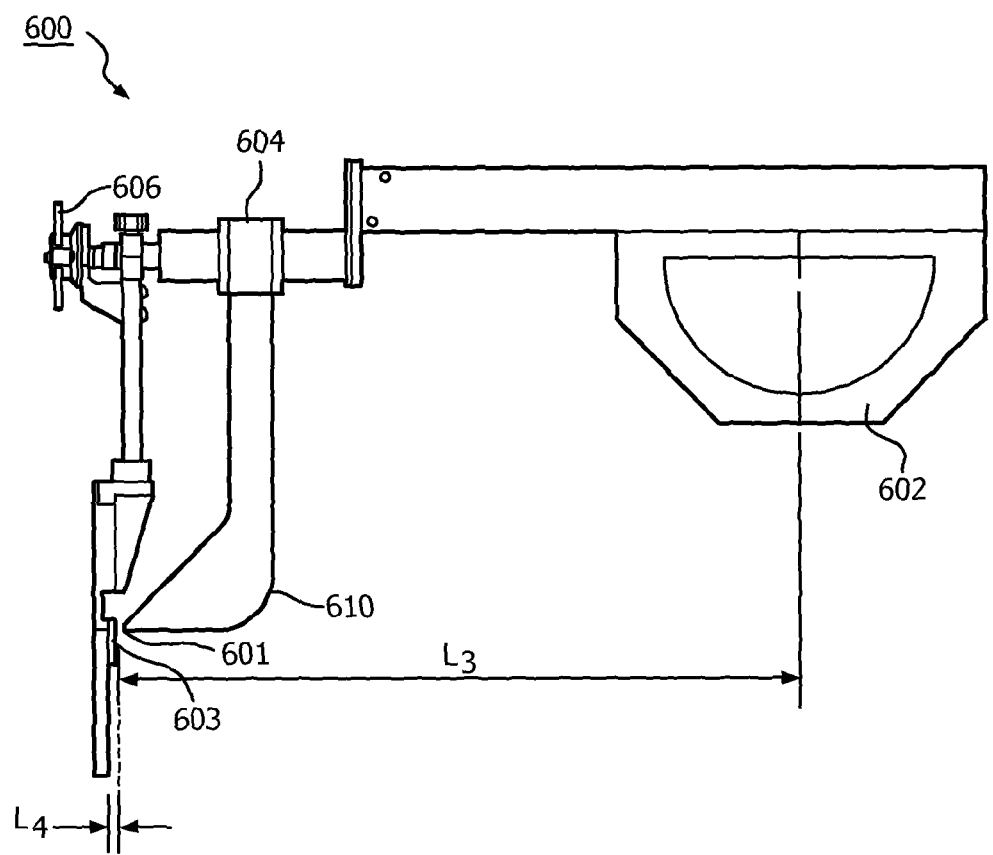
FIG. 6 shows a further exemplary embodiment of the mapping gantry used in the method according to an exemplary embodiment of the present invention.

FIG. 6 shows an exemplary system according to a further exemplary embodiment of the present invention. As shown in FIG. 6, a mapping gantry 600 may include an indicator 610 which can touch and register off of the reference surface 603. For example, the tip 601 of the indicator 610 can be positioned to the center of the camera 602 at a distance L1 as shown in FIG. 6. For example, this distance can be 844 mm. According to certain exemplary embodiments, this positioning can be permanent. The indicator 610 can also be removable so that the gantry can be used on the MRI magnet 100 with the gradient coil 400 installed. There is preferably a scale 604 attached to the mapping gantry 600 located near the vernier hand wheel 606.

Figure 7:
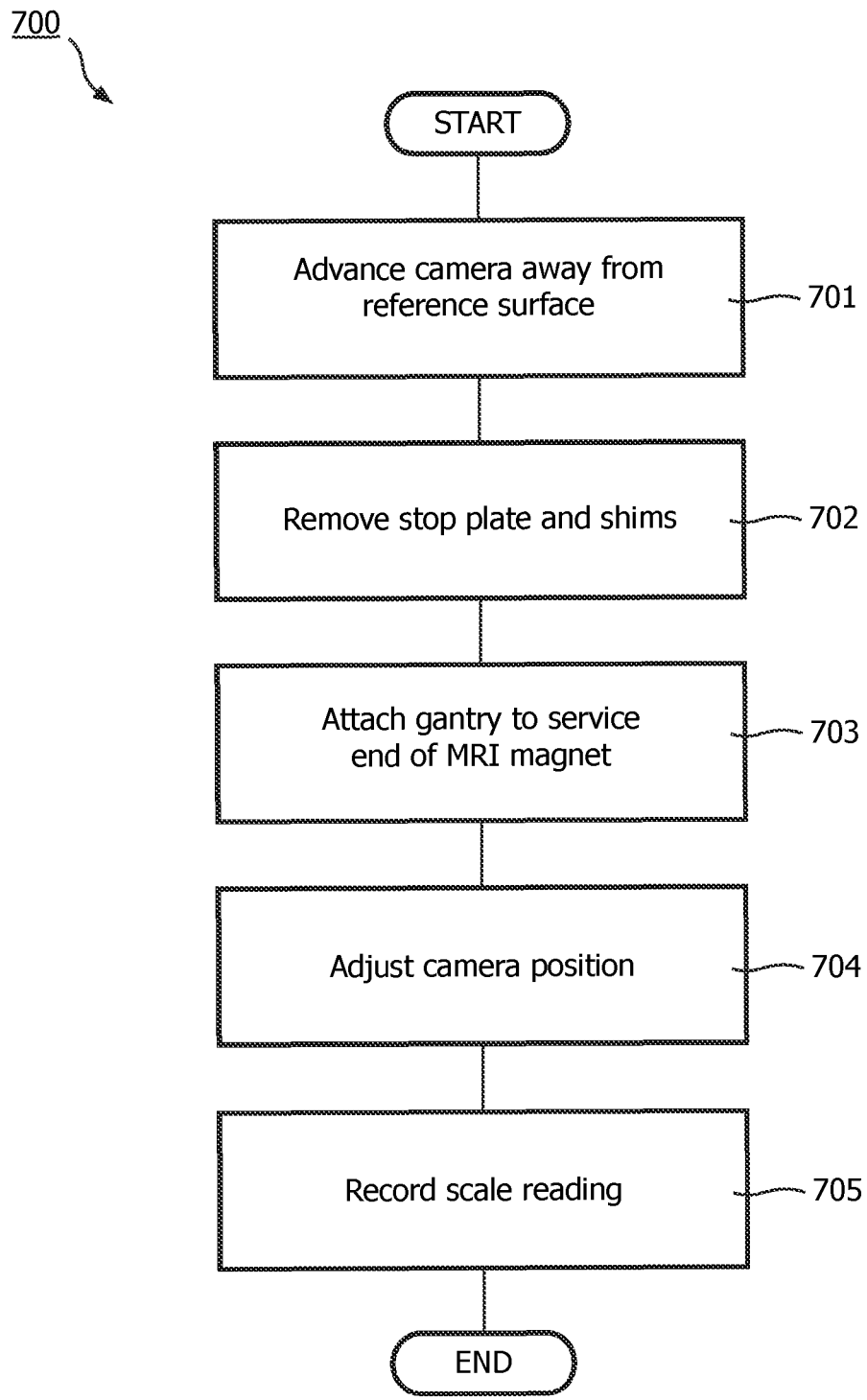
FIG. 7 shows an exemplary method for correcting angularity according to an exemplary embodiment of the present invention.

FIG. 7 shows a further exemplary embodiment of a method for correcting angularity in conjunction with the mapping gantry 600 of FIG. 6. The method 700 can be performed while the gradient coil 400 is installed within the central bore 101 of the MRI magnet 100. However, it should be noted that this method can also be performed on a bare MRI magnet 100 (i.e. without the gradient coil 400). The method 700 can include, for example, the following steps. At step 701, prior to installing the gantry support 305 onto the service end 102 of the MRI magnet 100, the camera 602 can be advanced a distance $L_4$ away from the reference surface 603. This can ensure that when the gantry 600 is secured, there will be no interference between the indicator 610 and the reference surface 603. At step 702, the stop plate 201 and shims 202 can be removed if they are installed. At step 703, the gantry 600 can be installed and secured to the service end 102 of the MRI magnet 100. At step 704, the position of the camera 602 can be adjusted so that the tip of indicator 601 just touches the reference surface 603. This preferably places the camera 602 at the theoretical geometric center of the MRI magnet 100. At step 705, the reading on the scale 604 can be noted and recorded. After the angularity has been corrected, the magnetic center 104 can be located according to the exemplary method 500 explained above.

While the present invention has been shown and described with reference to particular exemplary embodiments, it will be understood by those skilled in the art that present invention is not limited thereto, but that various changes in form and details, including the combination of various features and embodiments, may be made therein without departing from the spirit and scope of the invention.

Those skilled in the art will understand that the above-described exemplary embodiments may be implemented in any number of manners, including, as a separate software module, as a combination of hardware and software, etc. For example, the mapping procedure 500 may be a program containing lines of code that, when compiled, may be executed on a processor. The programs may be embodied on a non-transitory computer readable storage medium.

It is noted that the claims may include reference signs/numerals in accordance with PCT Rule 6.2(b). However, the present claims should not be considered to be limited to the exemplary embodiments corresponding to the reference signs/numerals.

It will be apparent to those skilled in the art that various modifications may be made to the disclosed exemplary embodiments and methods and alternatives without departing from the spirit or scope of the disclosure. Thus, it is intended that the present disclosure cover modifications and variations provided that they come within the scope of the appended claims and their equivalents.

What is claimed is:

1. A method comprising:
    determining a first location within a magnetic resonance imaging (MRI) magnet with respect to a first predetermined reference surface of the MRI magnet, the first location representing a center of a magnetic field of the MRI magnet, wherein determining the first location includes:
        installing a mapping gantry at one end of the MRI magnet with a camera of the mapping gantry extending into the bore of the MRI magnet,
        positioning the camera at a geometric center of the MRI magnet, and
        determining an offset distance from the position of the camera to the center of the magnetic field;
    determining a second location within a gradient coil with respect to a second predetermined reference surface of the gradient coil, the second location representing an isocenter of the gradient coil, wherein when the gradient coil is installed within a bore of the MRI magnet, the second predetermined reference surface abuts the first predetermined reference surface;
    determining an adjusted position for the first predetermined reference surface as a function of the first location and the second location, the adjusted position corresponding to a position of the first predetermined reference surface at which the first location coincides with the second location when the gradient coil is installed within the bore of the MRI magnet; and
    installing the gradient coil within the bore of the MRI magnet; and
    coupling the gradient coil to the MRI magnet via the first predetermined reference surface and the second predetermined reference surface.

2. The method of claim 1, further comprising:
    repositioning the camera at the first location; and
    taking a final map of the magnetic field of the MRI magnet.

3. A method comprising:
    determining a first location within a magnetic resonance imaging (MRI) magnet with respect to a first predetermined reference surface of the MRI magnet, the first location representing a center of a magnetic field of the MRI magnet;
    determining a second location within a gradient coil with respect to a second predetermined reference surface of the gradient coil, the second location representing an isocenter of the gradient coil, wherein when the gradient coil is installed within a bore of the MRI magnet, the second predetermined reference surface abuts the first predetermined reference surface;
    determining an adjusted position for the first predetermined reference surface as a function of the first location and the second location, the adjusted position corresponding to a position of the first predetermined reference surface at which the first location coincides with the second location when the gradient coil is installed within the bore of the MRI magnet;
    wherein determining the adjusted position further includes at least one of recording the adjusted position and determining a corrected angularity of the installed mapping gantry;
    installing the gradient coil within the bore of the MRI magnet; and
    coupling the gradient coil to the MRI magnet via the first predetermined reference surface and the second predetermined reference surface.

4. The method of claim 3, wherein the adjusted position is marked on the first predetermined reference surface.

5. The method of claim 4, wherein the adjusted position and the corrected angularity is marked on the first predetermined reference surface.

6. A magnetic resonance imaging (MRI) system, comprising:
    an MRI magnet including a bore, generating a magnetic field, defining a first location representing a center of the magnetic field in the bore, and having a first predetermined reference surface; and
    a gradient coil disposed within the bore having an isocenter, a second predetermined reference surface, and a location representing an isocenter;
    wherein the second predetermined reference surface of the gradient coil abuts the first predetermined reference surface of the MRI magnet;
    wherein the first predetermined reference surface is adjusted to an adjusted position, the adjusted position being determined as a function of the first location and the second location and corresponding to a position of the first predetermined reference surface at which the first location coincides with the second location when the gradient coil is installed within the bore; and
    wherein the gradient coil is coupled to the MRI magnet via the first predetermined reference surface and the second predetermined reference surface.

7. The MRI system of claim 6, further including:
    a mapping gantry installed at one end of the MRI magnet and configured to determine the first location;
    a camera of the mapping gantry extending into the bore of the MRI magnet, the camera being adjustably positioned at a geometric center of the MRI magnet; and
    an offset distance between the position of the camera and the center of the magnetic field.

8. The MRI system of claim 6, wherein the camera is configured to be repositioned at the first location to generate a final map of the magnetic field of the MRI magnet.

9. The MRI system of claim 6, wherein the first predetermined reference surface comprises a first marking indicating the adjusted position.

10. The MRI system of claim 9, wherein the first predetermined reference surface comprises a second marking indicating a corrected angularity.

11. A method of installing a gradient coil in a bore of an MRI magnet, the method comprising:
    detaching a stop plate from a service end of the MRI magnet, the stop plate having a stop plate reference surface offset from the service end by a preselected shim distance;
    attaching a mapping gantry to the service end of the MRI magnet offset from the service end by the preselected shim distance, the mapping gantry including a camera mounted to a longitudinally adjustable arm extending into the bore of the MRI magnet;

longitudinally adjusting the arm by an offset distance to position the camera at a magnetic center of the MRI magnet;

detaching the mapping gantry from the service end;

adjusting the preselected shim distance in accordance with the offset distance;

reattaching the stop plate to the service end;

installing a gradient coil in the bore of the MRI magnet with a gradient coil reference surface of the gradient coil abutting the stop plate reference surface of the stop plate.

12. The method of claim 11, wherein when the mapping gantry is initially attached to the service end of the MRI magnet, the camera extends into the bore of the MRI magnet by a distance corresponding to a distance between the gradient coil reference surface and an isocenter of the gradient coil.

13. A combination MRI magnet and gradient coil in which the MRI magnet and the gradient coil are aligned using the method of claim 11.

* * * * *